United States Patent
Feurle

(10) Patent No.: US 6,728,143 B2
(45) Date of Patent: Apr. 27, 2004

(54) INTEGRATED MEMORY

(75) Inventor: Robert Feurle, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/151,088

(22) Filed: May 20, 2002

(65) Prior Publication Data

US 2002/0172085 A1 Nov. 21, 2002

(30) Foreign Application Priority Data

May 18, 2001 (DE) .......................... 101 24 278

(51) Int. Cl.[7] .............................................. G11C 7/00
(52) U.S. Cl. ..................................... 365/191; 365/193
(58) Field of Search ................................. 365/191, 193

(56) References Cited

U.S. PATENT DOCUMENTS 6,215,709 B1 * 4/2001 Wright et al. .......... 365/189.11

* cited by examiner

*Primary Examiner*—M. Tran
(74) *Attorney, Agent, or Firm*—Laurence A. Greenberg; Werner H. Stemer; Gregory L. Mayback

(57) ABSTRACT

An integrated memory having a memory cell array has a control circuit for controlling a memory access for reading out or writing a data signal of one of the memory cells. The control circuit receives, for a memory access, an access command in the form of an activation command, a read command or a write command. Furthermore, the control circuit is designed and can be operated in such a way that, for a memory access, a configuration value for a CAS latency and/or a configuration value for specifying a burst access is received in a combined manner with the access command. As a result, a mode register and a corresponding programming step for programming the register can be eliminated.

7 Claims, 2 Drawing Sheets

FIG 2

| AC | Command Pins | | | |
|---|---|---|---|---|
| | 13 | 14 | 15 | 16 |
| Reading With Burst Length 2 | 0 | 0 | 0 | 0 |
| Reading With Burst Length 4 | 0 | 0 | 0 | 1 |
| Activation With CAS Latency 3 | 0 | 0 | 1 | 1 |
| ⋮ | | | | |
| Reading With Interleave Burst | 1 | 1 | 0 | 0 |

INTEGRATED MEMORY

BACKGROUND OF THE INVENTION

FIELD OF THE INVENTION

The present invention relates to an integrated memory having a memory cell array with memory cells and a control circuit for controlling a memory access for reading a data signal out from one of the memory cells or for writing a data signal to one of the memory cells.

An integrated memory generally has a memory cell array including word lines and bit lines. In this case, the memory cells are arranged at crossover points between the bit lines and the word lines. The memory cells are connected, via a respective selection transistor, to one of the bit lines so that a data signal can be read out and written in. The control input of the selection transistor is connected to one of the word lines. For a memory access, a control circuit for controlling the memory access generally receives an access command in the form of an activation command, a read command, or a write command. In order to read out or write a data signal, the respective selection transistor of the corresponding memory cell is turned on by an activated word line, as a result of which the data signal of a selected memory cell can subsequently be read out or written.

For a memory access, usually a plurality of memory cells are read from or written to within an access cycle. By way of example, a number or all of the memory cells along an activated word line are read from or written to. Such a memory access is generally referred to as a so-called burst, and the number of selected memory cells or the number of read-out or writing steps to be executed within an access cycle is referred to as the burst length. At the beginning of the access, a start address is applied to the memory, and the access to the memory cells to be addressed within a burst is controlled internally, without in each case applying a new is address to the memory.

In synchronous memories such as so-called SDRAM (Synchronous Dynamic Random Access Memories) and DDR-DRAM-memories(Double-Data Rate Dynamic Random Access Memories), configuration values of the memory such as, for example, the burst length are programmed in a so-called mode register. To that end, usually by using a correspondingly provided mode register set command, the value for the burst length is written to the mode register via address pins of the memory and is stored in the register for a later memory access. The programming of the mode register thus requires an additional processing step in the operation of the memory.

SUMMARY OF THE INVENTION

It is accordingly an object of the invention to provide an integrated memory which overcomes the above-mentioned disadvantages of the prior art apparatus of this general type.

In particular, it is an object of the invention to provide an integrated memory in which the values for configuring the memory can be set with comparatively little outlay.

With the foregoing and other objects in view there is provided, in accordance with the invention, an integrated memory, including: a memory cell array having memory cells; and a control circuit for controlling a read memory access for reading out a data signal from one of the memory cells and/or a write memory access for writing a data signal into one of the memory cells. For performing the memory access, the control circuit is designed for receiving an access command that is either an activation command, a read command, or a write command. For performing the memory access, the control circuit is designed for receiving a configuration value in a combined manner with the access command. The configuration value is either a CAS latency value or a value for specifying a burst access.

In accordance with an added feature of the invention, the control circuit is designed to receive a multi-bit signal that includes the access command and the configuration value.

In accordance with an additional feature of the invention, command pins are provided for receiving the access command and for receiving the configuration value. The command pins are connected to the control circuit.

In accordance with a further feature of the invention, the configuration value is the value for specifying the burst access; and the configuration value is either a value for specifying a burst length or a value for specifying a burst type.

In accordance with a further added feature of the invention, there is provided, address pins for transferring address signals for the memory access. The address pins are not capable of transferring the configuration value and are not used for transferring the configuration value.

The control circuit is designed and can be operated in such a way that, for a memory access, a configuration value for specifying a burst access and/or a configuration value for a so-called CAS latency is received in a combined manner with the access command. The access command is received for a memory access by the control circuit in the form of an activation command, a read command or a write command. In the inventive memory, the programming of a mode register can thus be eliminated since the corresponding configuration values can be received with the respective access command and can be set directly. The programming step for the mode register is thus obviated.

This affords the further advantage that the presence of a mode register can be dispensed with, thereby saving space on the memory. Moreover, the respective configuration values can advantageously be altered in each case with the reception of a new access command, without having to perform a renewed programming step for programming a mode register.

The abovementioned CAS latency is employed in synchronous memory modules and indicates at what instant a synchronized data output to outside the memory cell array begins in the event of a read access to one of the memory cells. As a result, in the event of a read access, a data packet is obtained on a bit line at a defined instant. The CAS latency is programmed and set in a manner dependent on the operating frequency of the memory, in order to obtain an optimum data throughput at any operating frequency in the event of a read access to one of the memory cells. To date, the CAS latency has usually been programmed via the mode register set command. Since, according to the invention, this value is transferred together with the access command, is set directly, and can correspondingly be altered with each new access command, higher flexibility at different operating frequencies of the memory is possible.

In one embodiment of the invention, the control circuit is designed and can be operated in such a way that the access command and also the configuration value for the CAS latency and/or the configuration value for specifying a burst access are received with a multi-bit signal. This makes it possible that, with the application of the access command, by way example, the configuration value for specifying the burst length and/or a burst type (for instance sequential read-out or interleaved in a so-called interleave burst) can be transferred in a multi-bit signal.

Other features which are considered as characteristic for the invention are set forth in the appended claims.

Although the invention is illustrated and described herein as embodied in a integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 shows a tabular overview of exemplary multi-bit signals for operating the inventive memory.

DESCRIPTION OF THE PREFERRED EMBODIMENTS

Figure 1:
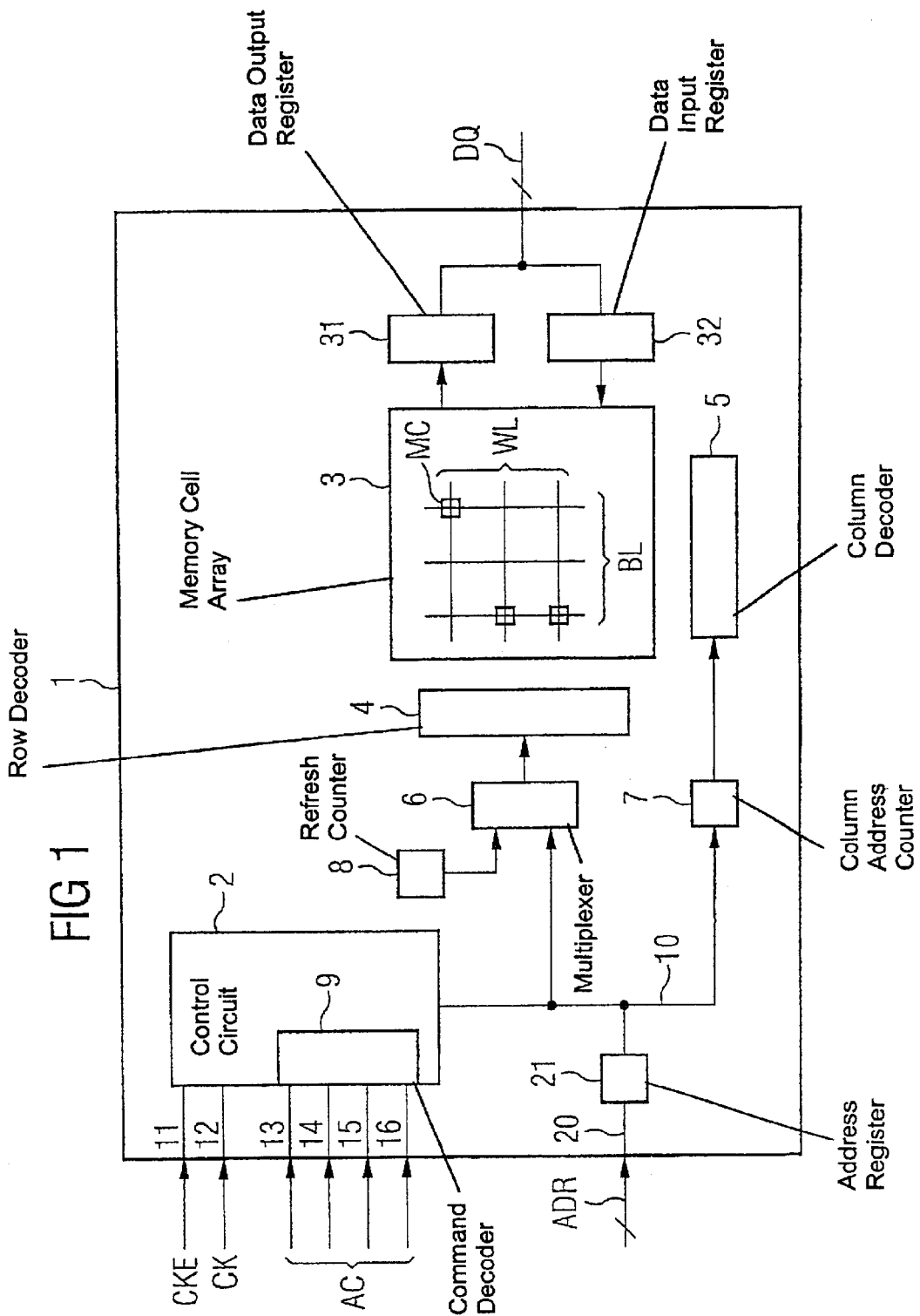
FIG. 1 shows an integrated memory with components for a memory access.

Referring now to the figures of the drawing in detail and first, particularly, to FIG. 1 thereof, there is shown an exemplary embodiment of an inventive synchronous DRAM memory. The memory 1 has a memory cell array 3 with bit lines BL and word lines WL. The memory cells MC are arranged at crossover points between the word lines WL and the bit lines BL and are in each case connected to one of the word lines WL and one of the bit lines BL. This is only illustrated diagrammatically in FIG. 1 for the sake of clarity. The memory cells MC are selected via the respective word lines WL for a reading or writing operation. Via the bit lines BL, a data signal is read from one of the memory cells MC or written to one of the memory cells MC. The read-out or writing-in of a data signal is performed via the data terminal DQ, and via a data output register 31 or a data input register 32.

The selection of the corresponding word lines and bit lines for a memory access is performed using a row decoder 4 and column decoder 5. The row decoder 4 is driven by a row address multiplexer 6 and the column decoder 5 is driven by a column address counter 7. The column address counter 7 and the row address multiplexer 6 are connected via a communication bus 10 to an address register 21, via which addresses ADR are read in at address terminals 20. The row address multiplexer 6 is additionally connected to a so-called refresh counter 8, via which a refresh operation of the memory can be carried out.

The memory has command pins 13 to 16 connected to the control circuit 2. They serve for receiving access commands, in this case in the form of an activation command, a read command, or a write command, and also for the combined reception of the configuration value for the CAS latency and/or of the configuration value for specifying the burst access. The corresponding multi-bit signals AC are fed, in particular, to a command decoder 9 contained in the control circuit 2. A clock signal CK is received via the terminal 12 and an activation signal CKE in this regard is received via the terminal 11.

The control circuit 2 serves for controlling a memory access to the memory cell array 3 via the communication bus 10. The components connected thereto are driven correspondingly. The control circuit 2 is connected to the terminal for the clock signal CK, which is made available for example by a controller or a processor. The control circuit 2 is driven for a memory access by control signals AC which indicate, for example, a beginning and the type (reading, writing) of a memory access. The configuration values with regard to burst access and CAS latency which are read in with the respective access command are received by the control circuit 2 and are processed correspondingly for the memory access.

With a multi-bit signal AC, by way of example, the memory is activated, and at the same time, the CAS latency is set (in this respect, also see FIG. 2). The CAS latency is used, in the event of a read access to one of the memory cells MC, to define the beginning of a data output—synchronized with a clock signal—to outside the memory cell array 3. In this case, the CAS latency specifies the number of clock cycles during which a wait is effected, relative to the beginning of the read access, in order to read out the data signal.

Further signal combinations for the multi-bit signal AC are shown by way of example in FIG. 2. For example, a read command is combined with the burst length 2, that is to say the memory cells along two word lines are read in a read access. To that end, the command pins are allocated correspondingly altered bit signals depending on the combination. If the bit width of the command pins is insufficient for the number of possible variants, a plurality of command pins must correspondingly be provided.

For a memory access, addresses ADR of selected memory cells are applied via the address terminals 20. The address pins 20 for transferring address signals ADR cannot be used for transferring the configuration value for the CAS latency and/or the configuration value for specifying the burst access, for instance as for the purpose of programming a mode register. A mode register can be obviated since the configuration values are set directly via the command pins 13 to 16 for the respective memory access.

I claim:

1. An integrated memory, comprising:

a memory cell array having memory cells; and a control circuit for controlling a memory access selected from the group consisting of a read memory access for reading out a data signal from one of said memory cells and a write memory access for writing a data signal into one of said memory cells;

for performing the memory access, said control circuit designed for receiving an access command selected from the group consisting of an activation command, a read command, and a write command;

for performing the memory access, said control circuit designed for receiving a configuration value in a combined manner with the access command; and the configuration value being selected from the group consisting of a CAS latency value and a value for specifying a burst access.

2. The integrated memory according to claim 1, wherein: said control circuit is designed to receive a multi-bit signal that includes the access command and the configuration value.

3. The integrated memory according to claim 2, comprising:

command pins for receiving the access command and for receiving the configuration value;

said command pins connected to said control circuit.

4. The integrated memory according to claim 1, comprising:
    command pins for receiving the access command and for receiving the configuration value;
    said command pins connected to said control circuit.

5. The integrated memory according to claim 1, wherein:
    the configuration value is the value for specifying the burst access; and
    the configuration value is selected from the group consisting of a value for specifying a burst length and a value for specifying a burst type.

6. The integrated memory according to claim 1, comprising:
    address pins for transferring address signals for the memory access;
    said address pins being not capable of transferring the configuration value.

7. The integrated memory according to claim 1, comprising:
    address pins for transferring address signals for the memory access;
    said address pins not being used for transferring the configuration value.

* * * * *